(12) United States Patent
Asahi

(10) Patent No.: US 7,772,674 B2
(45) Date of Patent: Aug. 10, 2010

(54) SEMICONDUCTOR INTEGRATED CIRCUIT WITH SPIRAL INDUCTORS

(75) Inventor: Naoko Asahi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 617 days.

(21) Appl. No.: 11/727,892

(22) Filed: Mar. 28, 2007

(65) Prior Publication Data

US 2007/0228515 A1 Oct. 4, 2007

(30) Foreign Application Priority Data

Mar. 30, 2006 (JP) ............................. 2006-095054

(51) Int. Cl.
 *H01L 21/20* (2006.01)
(52) U.S. Cl. ................. 257/531; 257/277; 257/E21.022
(58) Field of Classification Search ................. 257/531, 257/277, E21.022

See application file for complete search history.

(56) References Cited

U.S. PATENT DOCUMENTS 6,534,843 B2 * 3/2003 Acosta et al. ............... 257/531
6,730,983 B2 5/2004 Minami 2006/0163692 A1 * 7/2006 Detecheverry et al. ...... 257/531
2010/0068864 A1 * 3/2010 Hopper et al. .............. 438/381

FOREIGN PATENT DOCUMENTS

JP 2002-110908 A 4/2002

OTHER PUBLICATIONS

L. F. Tiemeijer et al., "Record Q Symmetrical Inductors for 10-GHz LC-VCOs in 0.18-μm Gate-Length CMOS," IEEE Electron Device letters, vol. 23, No. 12, Dec. 2002, pp. 713-715.
C. Patrick Yue et al., "On-Chip Spiral Inductors with Patterned Ground Shields for Si-Based RF IC's," IEEE Journal of Solid-State Circuits, vol. 33, No. 5, May 1998, pp. 743-752.

* cited by examiner

*Primary Examiner*—Kenneth A Parker
*Assistant Examiner*—Jose R Diaz
(74) *Attorney, Agent, or Firm*—Foley & Lardner LLP

(57) ABSTRACT

A spiral inductor, which is formed of a spiral wiring pattern, is formed in an inductor formation region which is assigned within an IC chip. A plurality of dummy wiring lines are formed according to a given design rule on an inside region surrounded by the spiral inductor within the inductor formation region and on an outside region of the spiral inductor within the inductor formation region. Each of the plurality of dummy wiring lines is formed to have such a shape that at least one side of a closed loop is opened, and the plurality of dummy wiring lines are disposed to have regularity and/or uniformity at a given distance from the spiral inductor.

10 Claims, 1 Drawing Sheet

SEMICONDUCTOR INTEGRATED CIRCUIT WITH SPIRAL INDUCTORS

CROSS-REFERENCE TO RELATED APPLICATIONS

This application is based upon and claims the benefit of priority from prior Japanese Patent Application No. 2006-095054, filed Mar. 30, 2006, the entire contents of which are incorporated herein by reference.

BACKGROUND OF THE INVENTION

1. Field of the Invention

The present invention relates to a semiconductor integrated circuit including a spiral inductor which is formed of a spiral-line-shaped electrically conductive layer, with dummy wiring lines being disposed on peripheral areas of the spiral inductor, and more particularly to a semiconductor integrated circuit for a radio-frequency receiving element.

2. Description of the Related Art

In the modern fabrication generation, such a design rule has begun to be proposed that when a spiral inductor is to be formed of a metal wiring layer in a semiconductor integrated circuit for a radio-frequency receiving element, for instance, dummy wiring lines which are formed of metal wiring layers are disposed to have a predetermined coverage on peripheral areas of the spiral inductor. With the adoption of this design rule, non-uniformity in chemical mechanical polishing (CMP) and peeling of wiring lines can be prevented. For example, according to one proposed design rule, in a case where patterns of wiring layers are present on a region with a predetermined area, which includes a spiral inductor and peripheral areas of the spiral inductor but the coverage of these patterns of the wiring layers does not reach a prescribed level, patterns of dummy wiring lines are automatically and randomly generated. The coverage of the wiring layers, in this context, means the ratio of wiring patterns, that is, the area occupied by wiring patterns within a predetermined region in each of multiple wiring layers.

It has been clarified that in the case where dummy wiring patterns are automatically disposed near the spiral inductor, when a dummy wiring pattern is generated under the spiral inductor, a parasitic capacitance and a parasitic inductance will occur and the inductor-quality factor Q of the spiral inductor deteriorates. Thus, there is a demand for the establishment of a proper design rule relating to the arrangement of the dummy wiring lines. The resistance value of the spiral inductor is expressed by R, the inductance value of the spiral inductor is expressed by L and the angular frequency of a radio-frequency signal which is applied to the spiral inductor is expressed by ω, the following relationship is established: Q=ωL/R.

When the patterns of the dummy wiring lines are to be disposed and the patterns are not automatically generated but are manually disposed, eddy current may occur in the dummy wiring lines, depending on the shapes of the patterns. Thus, the Q of the spiral inductor may also be degraded in the case of manually disposing the dummy wiring lines.

Jpn. Pat. Appln. KOKAI Publication No. 2002-110908 discloses that a spiral inductor, which is formed of a spiral-line-shaped electrically conductive layer, is formed on a substrate, and a trench for device isolation is formed in the substrate surface such that a projection portion, which becomes a dummy device region with an upper surface for controlling a CMP step, is formed on a region excluding a region immediately under the spiral-line-shaped electrically conductive layer.

BRIEF SUMMARY OF THE INVENTION

According to an aspect of the present invention, there is provided a semiconductor integrated circuit comprising: a spiral inductor formed of a spiral wiring pattern, the spiral inductor being formed in an inductor formation region of a semiconductor integrated circuit chip; and a plurality of dummy wiring lines which are disposed according to a given design rule on an inside region surrounded by the spiral inductor within the inductor formation region and on an outside region of the spiral inductor within the inductor formation region, each of the plurality of dummy wiring lines being formed to have such a shape that at least one side of a closed loop is opened, and the plurality of dummy wiring lines being disposed to have regularity and/or uniformity at a given distance from the spiral inductor.

DETAILED DESCRIPTION OF THE INVENTION

Figure 1:
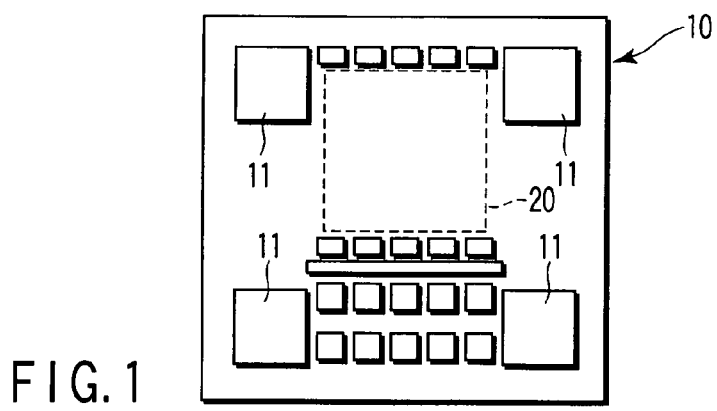
FIG. 1 is a plan view of a pattern layout of a CMOS-type IC chip according to an embodiment of the present invention, which includes a spiral inductor.

An embodiment of the present invention will now be described in detail with reference to the accompanying drawings. In describing the embodiment, common parts are denoted by like reference numerals throughout the drawings, and an overlapping description is omitted.

FIG. 1 shows a pattern layout of a CMOS type IC chip according to an embodiment of the invention. The CMOS type IC chip is fabricated by a CMOS process. A plurality of functional blocks 11 having various functions are formed on the IC chip 10 shown in FIG. 1. In addition, a region with a predetermined area of, e.g. 150 μm×150 μm is assigned as a formation region 20 of a spiral inductor. In this region 20, a spiral inductor having a plan-view pattern, for example, as shown in FIG. 2, is formed.

Figure 2:
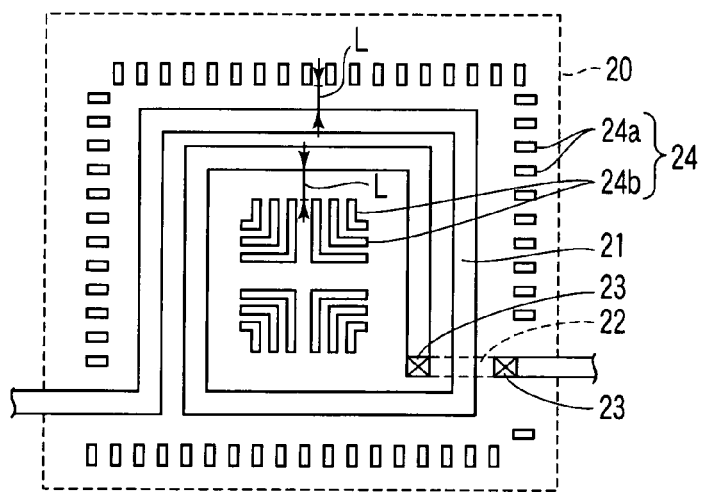
FIG. 2 is a plan view of the spiral inductor and dummy wiring lines which are disposed on peripheral areas of the spiral inductor in FIG. 1.

FIG. 2 shows, in enlarged scale, the formation region 20 of the spiral inductor shown in FIG. 1. A spiral inductor 21 is formed on a central part of the spiral inductor formation region 20. A plurality of dummy wiring lines 24 are formed according to a predetermined design rule on peripheral regions including an inside region surrounded by the spiral inductor 21 and an outside region around the spiral inductor 21.

The spiral inductor 21 is formed of a pattern of, e.g. a Cu wiring line having a rectangular spiral shape. Both end portions of the spiral inductor 21 are led out to the outside of the spiral inductor formation region 20. One end portion of the spiral inductor 21 is directly led out to the outside of the formation region 20 of the spiral inductor. The other end portion of the spiral inductor 21 is led out to the outside of the formation region 20 of the spiral inductor in such a way that the other end portion of the spiral inductor 21 extends via a metal wiring line 22 that is formed under the spiral inductor 21 and thus detours under a part of the spiral inductor 21. Electrical connection between the spiral inductor 21 and the metal wiring line 22 is effected by electrically conductive plugs/contact portions 23, such as vias, which are buried in an interlayer insulation film which is formed between the metal wiring line 22 and the spiral inductor 21. The shape of the spiral inductor 21 is not limited to the rectangular spiral shape shown in FIG. 2. The shape of the spiral inductor 21 may be changed to, e.g. a nearly circular oxtagonal spiral shape.

A plurality of dummy wiring lines 24 are formed on peripheral regions of the spiral inductor 21, with a predetermined distance L being kept between the dummy wiring lines 24 and the spiral inductor 21. The distance L may be 1.2 μm or more, which is the current IC design standard, and may preferably be set at about 5 μm.

Even in a case where the plural dummy wiring lines 24 electrically affect the spiral inductor 21, the dummy wiring lines 24 are disposed so as to uniformly and equally affect the spiral inductor 21. Specifically, the dummy wiring lines 24 are disposed so as to have regularity or uniformity relative to the spiral inductor 21 or, preferably, both the regularity and uniformity relative to the spiral inductor 21. Each of the dummy wiring lines 24 must not have a closed loop shape which causes eddy current, e.g. a rectangular shape with four sides being closed. Examples of the shape of each dummy wiring line include a rectangular shape which constitutes one side of a closed loop, a square shape which constitutes one side of a closed loop, an L shape which constitutes two sides of a closed loop, and a square bracket (]) shape which constitutes three sides of a closed loop.

In the present embodiment, each of first dummy wiring lines 24a, which are disposed on an outside region of the spiral inductor 21 and are positioned closest to the spiral inductor 21, has a rectangular pattern which is opposed to the spiral inductor 21 in a direction substantially perpendicular to the spiral inductor 21. On the other hand, each of all dummy wiring lines 24b which are disposed on an inside region of the spiral inductor 21, or each of those second dummy wiring lines 24b, which are positioned closest to the spiral inductor 21, has an L-shaped pattern. In this case, the second dummy wiring lines 24b have different-sized similar L-shaped patterns that are concentrically disposed in four divided regions, into which the inside region of the spiral inductor 21 is divided on XY orthogonal coordinates. Each side of each L-shaped pattern is disposed to be substantially perpendicularly opposed to the spiral inductor 21.

The distance L between the spiral inductor 21 and each first dummy wiring line 24a, the distance L between the spiral inductor 21 and each second dummy wiring line 24b and the coverage (density) of the dummy wiring lines 24 disposed on the inside region of the spiral inductor 21 are properly determined. The lower-limit value of the distance L between the spiral inductor 21 and each second dummy wiring line 24b is determined with consideration given to minimize the effect of inductive coupling and capacitive coupling, which is exerted on the spiral inductor 21 by the dummy wiring lines. In addition, the upper-limit value of the distance L is determined by considering planarity by CMP on an upper interlayer insulation film and metal wiring layer at a time of forming the dummy wiring lines 24 as wiring lines having a multi-layer metal wiring structure. Furthermore, the upper limit value of the coverage (density) of the dummy wiring lines 24b on the inside region of the spiral inductor 21 is determined by considering the magnitude of the effect of inductive coupling and capacitive coupling, which is exerted on the spiral inductor 21 by the dummy wiring lines 24b. The coverage (density), in this context, is a ratio of a wiring area occupying a predetermined region on a wiring layer.

Each of the above-described dummy wiring line 24 can be fabricated, for example, manually at a stage of design, but it may be generated automatically. This does not deteriorate the effect of a conventional process in which dummy wiring lines are automatically generated, for example, in the case of the absence of a pattern of a wiring layer which has a prescribed coverage in a predetermined area on the region excluding the spiral inductor formation region 20.

Figure 3:
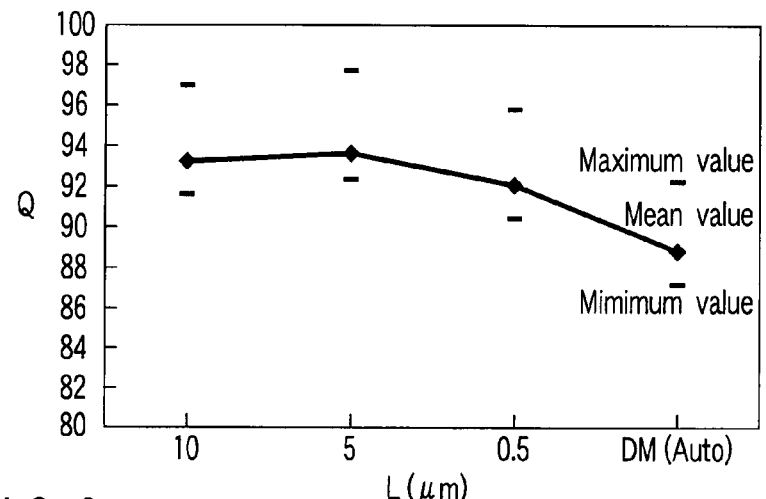
FIG. 3 is a characteristic graph showing simulation results of maximum values, minimum values and mean values of the inductor quality factor Q of the spiral inductor in various relationships between the spiral inductor and dummy wiring lines in FIG. 1.

FIG. 3 is a characteristic graph showing simulation results of maximum values, minimum values and mean values of the inductor quality factor Q of the spiral inductor 21 in various relationships between the spiral inductor 21 and the dummy wiring lines 24 in FIG. 1. FIG. 3 shows the cases in which the distance L between the spiral inductor 21 and dummy wiring line 24 is varied between three values, with the line width of the spiral inductor 21 being set at 152 μm, and the case in which the dummy wiring lines are randomly and automatically generated and disposed (DM(Auto)) with the distance L between the spiral inductor 21 and dummy wiring lines 24 being fixed at 0.3 μm. The reference value of the Q, in the case where the dummy wiring lines 24 are not formed in the formation region 20 of the spiral inductor, is set at 100, and the maximum value, minimum value and mean value of the Q are indicated in comparison to the reference value. In general, the Q of the spiral inductor 21 has a frequency dependency. In this simulation, 5 GHz is used as a frequency for measurement.

In the meantime, in the case of forming the dummy wiring lines 24, compared to the case of forming no dummy wiring line, the Q of the spiral inductor 21 slightly deteriorates due to the effect of the dummy wiring lines 24. However, as is understood from FIG. 3, when the distance L between the spiral inductor 21 and dummy wiring lines 24 is set at about 5 μm, which is greater than 1.2 μm that is the current IC design standard value, the Q can be optimized and the degradation in Q can be suppressed.

As has been described above, according to the IC of the present embodiment, the dummy wiring lines, each of which is formed to have such a shape that at least one side of a closed loop is opened, are disposed according to a predetermined rule at the predetermined distance L or more from the spiral inductor 21 so as to have regularity and/or uniformity relative to the spiral inductor 21. Thereby, the effect of inductive coupling and capacitive coupling, which is exerted on the spiral inductor 21 by the dummy wiring lines 24, is made substantially uniform. That is, a local variation in the effect of the inductive coupling and capacitive coupling can be eliminated, and the non-uniformity in characteristics of the spiral inductor 21 can be reduced. As a result, the Q of the spiral inductor 21 can be prevented from deteriorating due to the formation of dummy wiring lines 24. Moreover, deterioration in performance of the IC, which incorporates the spiral inductor 21, can be prevented, and an increase in range of applications of the IC can be expected. With possible future microfabrication of ICs, the restrictions relating to the coverage will become severe more and more. However, since the effect that is exerted on the spiral inductor 21 by the dummy wiring lines 24 can be minimized as described above, it becomes possible to advantageously deal with the future microfabrication of ICs.

As described above, the dummy wiring lines, which are disposed on the inside region of the spiral inductor 21, have different-sized similar L-shaped patterns that are concentrically disposed in the four divided regions on the XY orthogonal coordinates, and each side of each L-shaped pattern is disposed to be opposed substantially perpendicular to the spiral inductor 21. Thereby, the above-described advantages can easily be obtained.

Furthermore, as described above, each of the first dummy wiring lines 24a, which are disposed on the outside region of the spiral inductor 21 and are positioned closest to the spiral inductor 21, has a rectangular or square pattern which is opposed substantially perpendicular to the spiral inductor 21. Thereby, the above-described advantages can easily be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
    a spiral inductor formed of a spiral wiring pattern, the spiral inductor being formed in an inductor formation region of a semiconductor integrated circuit chip; and
    a plurality of dummy wiring lines which are disposed according to a given design rule on an inside region surrounded by the spiral inductor within the inductor formation region and on an outside region of the spiral inductor within the inductor formation region, each of the plurality of dummy wiring lines being formed to have a shape that at least one side of a closed loop is opened, and the plurality of dummy wiring lines being disposed to have regularity and/or uniformity at a given distance from the spiral inductor;
    wherein each of the plurality of dummy wiring lines disposed on the inside region surrounded by the spiral inductor has an L-shaped pattern.

2. The semiconductor integrated circuit according to claim 1, wherein a distance between the spiral inductor and each of the plurality of dummy wiring lines is set according to a given design rule, and a coverage of the plurality of dummy wiring lines disposed on the inside region surrounded by the spiral inductor is set according to a given design rule.

3. The semiconductor integrated circuit according to claim 2, wherein a lower-limit value of the distance between the spiral inductor and each of the plurality of dummy wiring lines is determined in consideration of a magnitude of an effect of inductive coupling and capacitive coupling, which is exerted on the spiral inductor by the plurality of dummy wiring lines, and planarity of an interlayer insulation film and a metal wiring layer by chemical mechanical polishing at a time of forming the plurality of dummy wiring lines.

4. The semiconductor integrated circuit according to claim 2, wherein an upper-limit value of the distance between the spiral inductor and each of the plurality of dummy wiring lines is determined in consideration of planarity of an interlayer insulation film and a metal wiring layer by chemical mechanical polishing at a time of forming the plurality of dummy wiring lines.

5. The semiconductor integrated circuit according to claim 2, wherein the coverage of the plurality of dummy wiring lines disposed on the inside region surrounded by the spiral inductor is determined in consideration of a magnitude of an effect of inductive coupling and capacitive coupling, which is exerted on the spiral inductor by the plurality of dummy wiring lines.

6. The semiconductor integrated circuit according to claim 2, wherein the distance between the spiral inductor and each of the plurality of dummy wiring lines is 1.2 µm or more.

7. The semiconductor integrated circuit according to claim 6, wherein the distance between the spiral inductor and each of the plurality of dummy wiring lines is 5 µm.

8. The semiconductor integrated circuit according to claim 1, wherein each of the plurality of dummy wiring lines disposed on the outside region of the spiral inductor has a rectangular pattern.

9. The semiconductor integrated circuit according to claim 1, wherein each of the plurality of dummy wiring lines disposed on the outside region of the spiral inductor has a square pattern.

10. A semiconductor integrated circuit, comprising:
    a spiral inductor formed of a spiral wiring pattern, the spiral inductor being formed in an inductor formation region of a semiconductor integrated circuit chip; and
    a plurality of dummy wiring lines which are disposed according to a given design rule on an inside region surrounded by the spiral inductor within the inductor formation region and on an outside region of the spiral inductor within the inductor formation region, each of the plurality of dummy wiring lines being formed to have a shape that at least one side of a closed loop is opened, and the plurality of dummy wiring lines being disposed to have regularity and/or uniformity at a given distance from the spiral inductor;
    wherein the inside region surrounded by the spiral inductor is divided into four regions on XY orthogonal coordinates, and the plurality of dummy wiring lines are concentrically disposed on the four divided regions and have different-sized similar L-shaped patterns.

* * * * *